United States Patent [19]
Wingender et al.

[11] Patent Number: 6,166,674
[45] Date of Patent: Dec. 26, 2000

[54] ANALOG TO DIGITAL CONVERTER USING SEVERAL CASCADE-CONNECTED INTERPOLATION CIRCUITS

[75] Inventors: Marc Wingender, Saint Egreve; Stéphane Le Tual, Veurey Voroize, both of France

[73] Assignee: Thomson-CSF, Paris, France

[21] Appl. No.: 08/885,959

[22] Filed: Jun. 30, 1997

[30] Foreign Application Priority Data

Jun. 28, 1996 [FR] France .................................. 96 08083

[51] Int. Cl.[7] .............................. H03M 1/34; H03M 1/62
[52] U.S. Cl. .......................................... 341/158; 341/139
[58] Field of Search .................................. 341/158, 159, 341/118, 120, 155, 143, 138, 139, 156; 348/424; 327/105; 702/67

[56] References Cited

U.S. PATENT DOCUMENTS

| | | | |
|---|---|---|---|
| 4,455,613 | 6/1984 | Shoemaker | 702/67 |
| 5,298,814 | 3/1994 | Caruso | 327/105 |
| 5,444,447 | 8/1995 | Wingender . | |
| 5,471,210 | 11/1995 | Wingender et al. . | |
| 5,495,247 | 2/1996 | Yamamoto et al. . | |
| 5,684,485 | 11/1997 | Paillardet et al. | 341/159 |

FOREIGN PATENT DOCUMENTS

| | | |
|---|---|---|
| 0302 553 | 2/1989 | European Pat. Off. . |
| 0 406 973 A1 | 1/1991 | European Pat. Off. . |
| 2 699 025 | 6/1994 | France . |

*Primary Examiner*—Patrick Wamsley
*Attorney, Agent, or Firm*—Oblon, Spivak, McClelland, Maier & Neustadt, P.C.

[57] ABSTRACT

Disclosed is an analog to digital converter with several cascade-connected interpolation and selection circuits. The function of an interpolation circuit is to produce five pairs of output signals from three pairs of input signals and select three pairs from among the five pairs to apply them to the next stage. Each pair comprises two interpolation signals that vary symmetrically and monotonically as a function of the voltage Vin, the signals of one pair being equal when the voltage Vin is equal to a reference voltage associated with this pair. There are five reference voltage associated with the five pairs. Among these five reference voltages, the three reference voltages (and therefore also the three corresponding pairs of signals) that most closely surround the input voltage Vin are selected. The reference voltages are increasingly closer together as the operation progresses in the succession of cascade-connected stages. The signals used to select the pairs of signals are used in a decoder that gives the bits of the analog-digital conversion.

12 Claims, 9 Drawing Sheets

ANALOG TO DIGITAL CONVERTER USING SEVERAL CASCADE-CONNECTED INTERPOLATION CIRCUITS

BACKGROUND OF THE INVENTION

1. Field of the Invention

The invention relates to analog to digital converters, namely electronic circuits capable of converting an analog input signal into a precise digital value representing the amplitude of the analog signal. The digital value is obtained in the form of a word of several bits, generally encoded in pure binary form.

There are several existing methods of conversion, and the choice of one method rather than another depends on the performance characteristics required from the converter. Of these performance characteristics, the most important parameters are the following the resolution, defined by the number of bits of the output word providing an exact representation of the amplitude of the analog signal; the number of bits may range from 16 to 18, or even 20 for converters with the highest precision, and the precision is generally + or −½ least significant bit;

the speed, namely the number of conversion operations that can be performed in one second;

the power consumption: a fast and precise converter consumes far more energy than a slow, low-precision converter; now, the power consumption gives rise to a heating of the integrated circuit chip on which the converter is made. This heating must be compensated for by cooling means that make it difficult to use the circuit when there are constraints of space availability to be met. Furthermore, with the increasing number of so-called "portable" devices (namely devices working with batteries), the criterion of<<high power consumption>>is becomong synonymous also with the<<short lifetime of equipment>>;

and of course there is the cost of designing and manufacturing the converter related especially to the surface area of the integrated circuit chip used by the converter.

The qualities of an analog-digital converter result from a compromise between the above parameters, and an aim of the present invention is to improve this compromise.

2. Description of the Prior Art

The known analog to digital converter structures include:

successive approximation converters which compare the input analog signal Vin successively with digital values, each time approaching the value of the analog signal a little more closely; these converters work in at least N phases if the value is encoded on N bits; they are generally very slow for values of precision exceeding 6 or 8 bits;

"flash" converters which use $2^N$ parallel-connected comparators; the comparators each receive firstly the analog signal and secondly one of the $2^N$ reference voltages defined by a bridge of $2^N$ precision resistors; these converters are very fast (with generally two phases) but they are very bulky and consume a very great deal of power when the value of N reaches 10 to 12 bits;

combined converters having one coarse converter to obtain most significant bits and one fine converter to obtain least significant bits; the coarse converters may be fast, low-precision converters (with precision values of 4 to 6 bits for example); the fine converter must be precise even if it is slower.

Among the combined converters, several approaches have already been proposed.

In one approach, the coarse converter is a flash converter that gives P bits which are the most significant bits. This value is reconverted into an analog signal by a P bit digital to analog converter. The difference between the analog signal Vin and this reconverted value, also called a remainder or residue, is converted by a fine converter which determines the least significant bits of the conversion. There is a gain in power consumption and in the amount of space required as compared with the flash converter, but the digital to analog conversion takes time and requires a very precise control looping of the gains of the different parts of the circuit (namely the analog-digital converter and the digital-analog converter).

In another approach, the coarse converter is a so-called "parallel sub-range selection" circuit. It consists of a circuit for the selection of a group (or range) of three adjacent reference voltages from a number (or range) of reference voltages greater than three.

This circuit is capable of comparing the input signal Vin with the different reference voltages and then selecting a group of three adjacent main reference voltages such that Vin ranges between these reference voltages, and of making the necessary connections between these three reference voltages, three differential amplifiers and a fine converter circuit.

The coarse converter (by means of a flash converter) gives a digital value indicating the triplet of reference values between which Vin is located.

There is thus obtained an assessment of the adjacent reference range that is as close as possible to Vin. A structure of this type has already been described in the patent application FR-A-2 699 025.

Within this main reference range, a more precise encoding of Vin will then be done by the generation of new intermediate and equidistant reference values. There are several existing methods, but in any case the number of intermediate references must be doubled whenever it is sought to increase the fine encoding precision by a factor of two (namely 1 bit).

These intermediate reference values are generated by so-called "interpolation" circuits.

These interpolations circuits may be parallel or series interpolation circuits.

In parallel interpolation circuits, the number of elements (resistor, amplifier, etc.) implemented increases as the number of intermediate reference values, namely it increases by a factor of two whenever the fine encoding precision increases by 1 bit. For N bits, we therefore have $2^N$ elements. Hence limits are soon encountered in terms of space requirement and consumption.

By contrast, in the series interpolation circuits, to obtain N information bits, only N elements are necessary.

Hence, as compared with the parallel interpolation, there is a considerable gain in compactness and consumption.

Architectures of this kind have been described in the U.S. Pat. No. 5,126,742 and FR-A-2 699 025.

In these circuits, the number of intermediate references generated increases by a factor of two at output of each interpolation circuit. These circuits all have identical structures and are designed to be cascade-connected.

The signals are periodical functions of the input analog voltage Vin, having a sinusoidal shape. These new signals pass through zero not only when Vin is equal to the main reference voltages but also for intermediate reference voltages located in the middle of the interval between two adjacent main reference voltages.

The signals therefore make it possible to supply an information bit that is additional to the most significant bits obtained by the coarse converter. Signals thus obtained at output of a series interpolation circuit (or stage) are applied to the next stage, which is identical and has the same function as the preceding one (the creation of "period" signals that are again doubled).

The next stage again gives a supplementary bit for the value of Vin.

Continuing in this way, several stages can be cascade-connected to obtain the successive least significant bits of the conversion (it must be noted that these "folded" sinusoidal signals consist of loci of static points as a function of the static values of Vin and are not a priori a function of time).

However, there is a major drawback inherent in the circuits that carry out the folding: by structure, the use of folded signals implies the use of highly nonlinear elements and this is a characteristic that goes against the production of precise intermediate voltages.

The new intermediate voltage values therefore are not equidistant and the precision of the quantification of Vin is therefore diminished.

Now, whatever the interpolation method used for the fine conversion, the intermediate references generated between the main references should be as equidistant as possible.

Any imprecision with respect to this parameter will be expressed by a limitation in the precision of the fine encoding of Vin. Now, while the serial interpolation circuits have effectively resolved the problems of space requirement and consumption as compared with parallel interpolation circuits, it is with great difficulty that they permit encoding precision of over 10 bits.

This arises directly from the non-linearity of the folding method used.

SUMMARY OF THE INVENTION

The invention is therefore aimed at proposing a novel analog to digital converter structure making it possible to optimize, all at the same time, the qualities of reduced space requirement, low consumption and precision.

To this end, the invention proposes an analog to digital converter that possesses an input to receive an analog voltage Vin to be converted, wherein said converter comprises a succession of cascade-connected interpolation and selection circuits with at least one k order interpolation and selection circuit comprising:

three pairs of inputs receiving, as input signals, three pairs of output signals from a k−1 order interpolation and selection circuit, the signals of a pair having equal values when the voltage to be converted Vin is equal to one of the three k−1 order main reference voltages, these three voltages mutually defining an interval consisting of two k−1 order voltage half-intervals, means for the setting up, from the input signals, of five pairs of signals known as interpolation signals, each pair comprising two interpolation signals that vary symmetrically and monotonically as a function of the voltage Vin, the signals of one pair being equal when the voltage Vin is equal to a reference voltage associated with this pair, the five reference voltages associated with the five pairs being substantially, firstly, the three k−1 order main reference voltages and, secondly, two intermediate reference voltages located in the middle of the half-intervals defined by the three k−1 order main reference voltages, these five reference voltages being used to define three voltage intervals of a width equal to one of the k−1 order half-intervals, decision means to determine which of the five reference voltages are the three voltages that mutually define an interval with a width equal to a k−1 order half-interval and that most closely surround the input voltage Vin to be converted, the reference voltages thus selected being three k order main reference voltages, and means for the selection, from the five pairs of interpolation signals, of the three pairs such that the signals of one pair are equal when the voltage Vin is equal to one of the k order main reference voltages.

For each state, this cascade structure uses monotonic signals that intersect at a single point, unlike the prior art structures that use periodic folded signals intersecting at several points.

The k order interpolation and selection circuit is used to give one or two k order information bits related to the value of the voltage Vin to be converted. Indeed, at each operation, the successively higher-order circuits determine an interval of voltages that most closely surrounds the voltage Vin and the interval defined for the k order circuit is half of the interval defined for the k−1 order circuit.

The converter thus defined may be used as an independent converter by itself, or else as a fine converter in a structure comprising a coarse converter for the most significant bits and a fine converter for the least significant bits.

The first-order interpolation and selection circuit preferably receives the differential outputs from three differential amplifiers as input signals. These differential amplifiers receive the voltage Vin to be converted at a first input. At a second input, each of them receives one of the three primary voltage references. Each of these amplifiers gives two output voltages that vary symmetrically and monotonically as a function of the voltage Vin to be converted. The primary voltage references are spaced out with respect to one another so that the variation curves of the output voltages from the amplifier corresponding to the central reference intersect the variation curves of the output voltages from the two other amplifiers in a zone of linear variation of these output voltages.

The interpolation circuits in practice have five differential amplifiers, one decision circuit and one selection circuit controlled by the decision circuit for the orientation, to the outputs of the circuit, of the outputs of three differential amplifiers selected from among the five amplifiers.

The conversion structure according to the invention can be generalized by using interpolation and decision circuits that comprise a greater number of differential amplifiers and enable the selection of one interval of k order voltages out of seven or even out of fifteen instead of one interval out of three. This may be useful to reduce the number of cascade-connected stages, but it obviously increases the number of differential amplifiers used in each stage since it is necessary to produce nine or seventeen reference voltages of which three will be selected.

The invention therefore more generally proposes a method for the analog-digital conversion of an input voltage Vin using several cascade-connected interpolation circuits wherein:

there are applied, to the input of a k order interpolation circuit, three pairs of analog signals coming from three outputs of the preceding k−1 order interpolation circuit, the signals of a pair having equal values when the voltage Vin is equal to one of there k−1 order main reference voltages each associated with a respective pair, these three voltages mutually defining an interval formed by two k−1 order voltage half-intervals, there are produced, from these three pairs of signals, $P=2^p+1$ pairs of interpolation signals (p>1, P>3), each pair comprising two interpolation signals that vary symmetrically and monotonically as a function of the voltage Vin, the signals of a pair being equal when the voltage Vin is equal to a reference voltage associated with this pair, the P reference voltages associated with the P pairs being substantially, firstly, the three k–1 order main reference voltages and, secondly, at least two intermediate voltages located in the middle of the half-intervals defined by the three k–1 order main reference voltages, these P reference voltages enabling the definition of $2^p-1$ voltage intervals with a width equal to $\frac{1}{2}^{p-1}$ interval corresponding to the k–1 order, an operation is carried out to determine, as a function of the levels of the three pairs of input signals, that voltage interval, of the $2^p-1$ intervals, that most closely surrounds the input voltage Vin, this interval being formed by two half-intervals demarcated by three out of P reference voltages, these three voltages being called k order reference voltages, a selection is made, among the P pairs, of the three pairs associated with the three k order reference voltages, and these three pairs are applied to the output of the k order interpolation circuit.

The corresponding converter structure comprises several cascade-connected interpolation circuits with at least one k order interpolation circuit comprising:

three pairs of inputs receiving, as input signals, three pairs of output signals from a preceding interpolation circuit, the signals of a pair having equal values when the voltage Vin is equal to one of the three k–1 order main reference voltages each associated with a respective pair, these three voltages mutually defining an interval consisting of two k–1 order voltage half-intervals, means for the setting up, on the basis of the input signals, of $P=2^p+1$ pairs of interpolation signals (p>1, P>3), each pair comprising two interpolation signals that vary symmetrically and monotonically as a function of the voltage Vin, the signals of one pair being equal when the voltage Vin is equal to a reference voltage associated with this pair, the P reference voltages associated with the P pairs being substantially, firstly, the three k–1 order main reference voltages and, secondly, (P–3) intermediate reference voltages, the P reference voltages enabling the definition of $2^p-1$ voltage intervals with a width equal to $\frac{1}{2}^{p-1}$ interval corresponding to the k–1 order, decision means for the determining, as a function of the levels of the three pairs of input signals, of that voltage interval, among the $2^p-1$ intervals, that most closely surrounds the input voltage Vin, this interval consisting of two half-intervals demarcated by three out of P reference voltages, these three voltages being called k order reference voltages, and means for the selection, from among the P pairs, of the three pairs associated with the three k order reference voltages, to apply them to the output of the k order interpolation circuit.

BRIEF DESCRIPTION OF THE DRAWINGS

Other features and advantages of the invention shall appear from the following detailed description, made with reference to the appended drawings, of which.

MORE DETAILED DESCRIPTION

Figure 1:
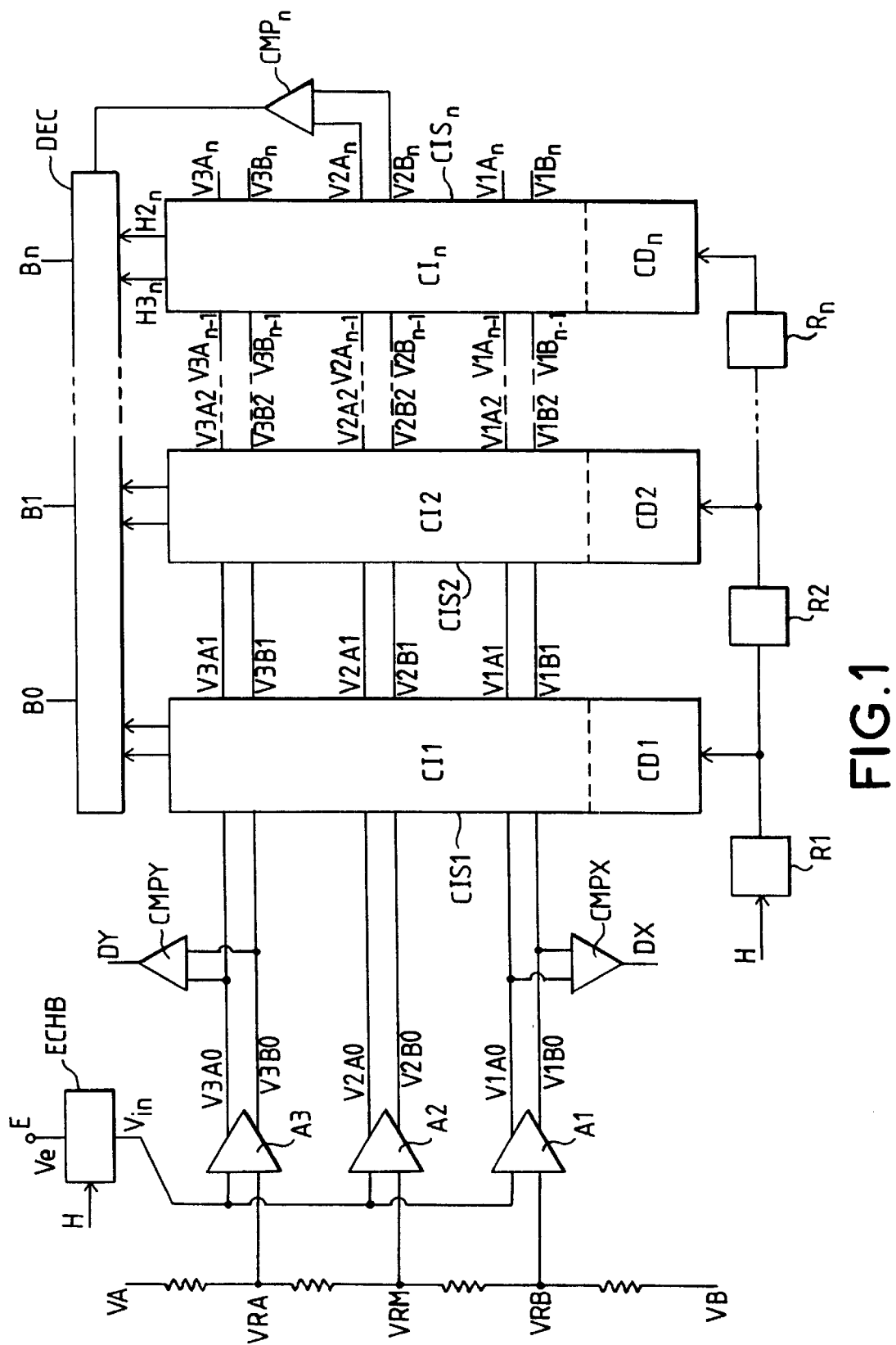
FIG. 1 shows a drawing of the general architecture of the converter according to the invention.

The general structure of the converter according to the invention is shown in FIG. 1.

The function of this converter is to give an n-bit digital signal representing, in digital form, the value of the amplitude of an input analog signal Vin. The m bits, according to a binary code, represent a value of Vin out of $2^n$ values evenly distributed between two main reference values VRA and VRB.

The input signal Vin may take any values between two extreme values Vext1 and Vext2 which may go well beyond the range of values located between VRA and VRB but, in any case, the output of the converter gives a digital representation of Vin only if Vin is between VRA and VRB. It will be seen however that the converter can also give an upward overflow signal or a downward overflow signal indicating that Vin is beyond the range VRA to VRB.

The main reference voltages VRA and VRB as well as another main reference voltage VRM that is equidistant from the values VRA and VRB are each applied respectively to a first input of a respective differential amplifier A1 (for VRB), A2 (for VRM) and A3 (for VRA).

The reference voltages are produced in any way but preferably through a bridge of precision registers supplied between two total reference voltages VA and VB. The intermediate taps of this bridge are computed to obtain the main reference voltages VRB, VRM and VRA.

Each differential amplifier has a second input to which an input voltage Vin to be converted is applied.

Preferably, this voltage comes from the output of a sample-and-hold circuit ECHB. The output voltage Vin periodically reproduces the value possessed by the voltage Ve at the input E of the sampler at the sampling instants and keeps it constant between two successive sampling instants.

Hereinafter, it will be assumed that it is the voltage Vin that constitutes the input signal of the converter although the analog signal to be converted is actually rather the signal Ve.

The sample-and-hold circuit ECHB is used to keep the value of the signal to be converted temporarily constant in order to enable conversion to a stable input value.

Figure 2:
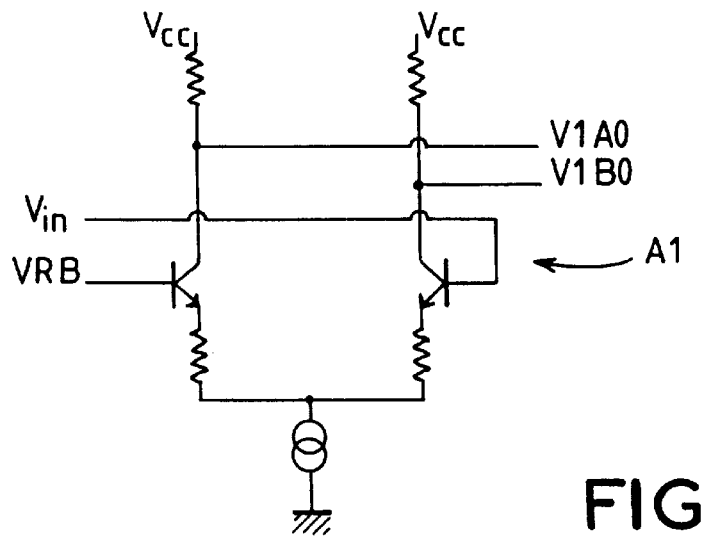
FIG. 2 shows a typical drawing of an differential amplifier such as the amplifier A1 of FIG. 1.

The differential amplifiers A1, A2, A3 are identical. The particular features of their transfer function (a function representing the progress of their output voltages as a function of their input voltage) will be specified further below. However, it can be stated, as of now, that these transfer functions will be obtained with amplifiers of a very commonly used type, set up in their simplest version, for example by a pair of differential arms supplied comprehensively by a constant current source with an input transistor and a resistive load in each arm. FIG. 2 shows a differential amplifier A1.

Each differential amplifier has two differential outputs. At these outputs, it gives two voltages that vary symmetrically as a function of the value of Vin, substantially linearly around a mean value Vm, common for both outputs and identical for the three amplifiers. This common mean value is the one obtained at output of an amplifier when the voltages on the two inputs of this amplifier are equal. Furthermore, the amplifiers are such that the voltages at the differential outputs vary monotonically with Vin for the entire range of possible values of Vin (in the interval VRB to VRA and beyond in the interval Vext1 to Vext2 of the possible values for Vin).

Figure 3:
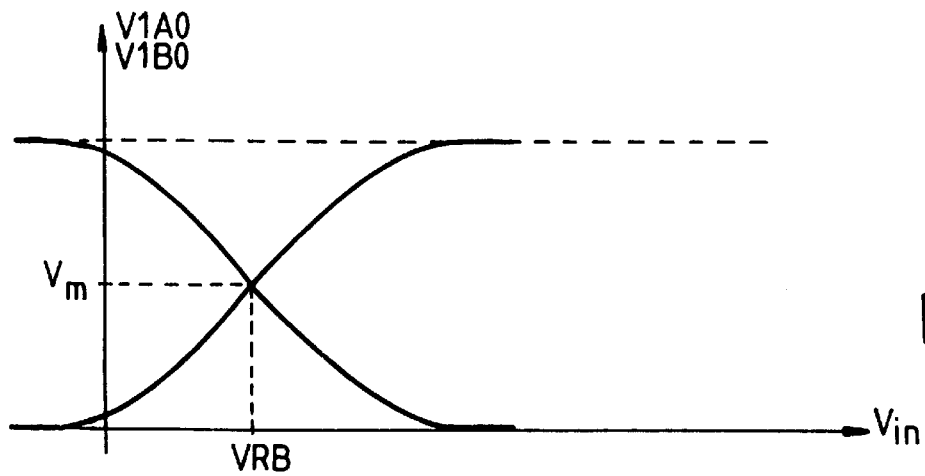
FIG. 3 shows the curves of variation of output voltage of one of the input differential amplifiers as a function of the voltage Vin to be converted.

FIG. 3 shows the curves of variation of the two differential output voltages (V1A0, V1B0) for a single amplifier (A1). The curves do not represent temporal waveforms of the output voltages but the changes undergone by these voltages as a function of the value of the input voltage Vin. These curves V1A0, V1B0 represent the standard transfer functions of a simple symmetrical differential amplifier with two input transistors, having one input taken to the reference voltage VRB and the other input taken to Vin. The curves V1A0, V1B0 are symmetrical, monotonic and intersect at an x-axis position VRB and y-axis position Vm where Vm is the value of the common potential of the outputs for a zero differential input voltage (Vin=VRB).

The curve portions, in the region of the point where they meet and even largely beyond this point, are linear and then, the greater the distance from this point, the greater do the values tend asymptotically towards two extreme values of output potential which depend on the supply voltages and current of the amplifier. The slopes of the linear portions are smaller if an emitter resistor is placed in series with the emitter of the transistor in each arm of the amplifier. The linearity of the linear portion is furthermore improved with an emitter resistor of this kind and it could therefore be advantageous to provide for differential amplifiers with emitter resistors.

It is important to have high linearity and efficient equality of the mean value Vm for the three amplifiers and linearity correction circuits may preferably be associated with the amplifiers A1, A2, A3 (see further below).

Figure 4:
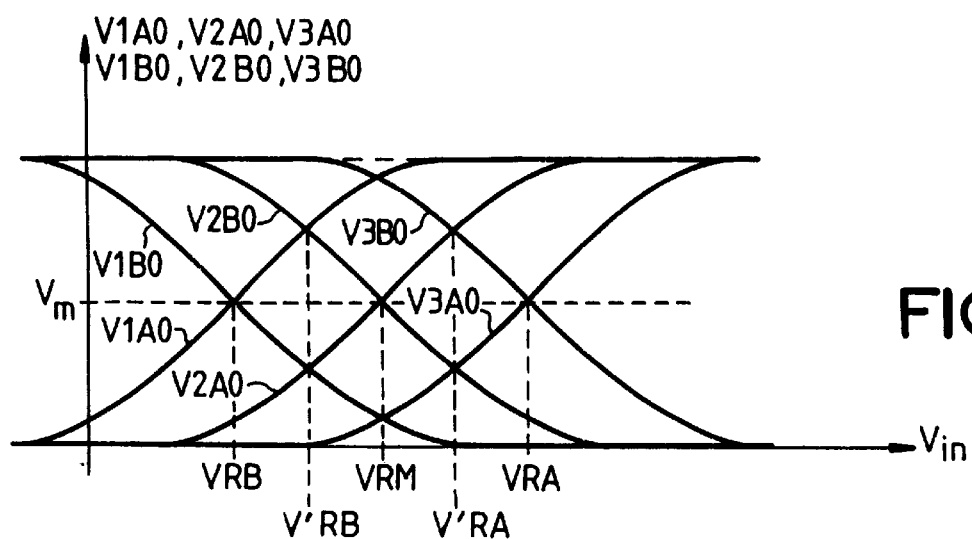
FIG. 4 shows the superimposition of the curves of variation of the three input differential amplifiers.

FIG. 4 gives a view in superimposition of the six output voltages corresponding to the three amplifiers: (V1A0, V1B0) for A1, (V2A0, V2B0) for A2, (V3A0, V3B0) for A3. These curves are identical but offset laterally with respect to each other since they are centered on the three different primary reference voltages VRB, VRM, VRA.

The following observations follow from the curves of variation of the output signals of the amplifiers A1, A2, A3.

First of all, provision may be made in the circuit of FIG. 1 for a comparator CMPX receiving the outputs of the first amplifier A1 to give a downward overflow logic signal DX (Vin<VRB) and also a comparator CMPY receiving the outputs of the third amplifier to give an upward overflow logic signal DY (Vin>VRA).

Then, if the amplifiers A1, A2, A3 are linear in a fairly wide range and identical to one another, the following particular features are obtained:

the curves of the symmetrical pair V1A0 and V1B0 intersect at the center of their linear zones; and similarly the curves of the pairs V2A0, V2B0 and V3A0, V3B0;

the curves of the intersecting pair V1A0, V2B0 (or of the other intersecting pair V2A0, V1B0) also intersect in their linear zones (but not at their center) for values of Vin equal to a fictitious intermediate reference voltage V'RB located in the middle of the half-interval VRB, VRM;

the curves of the intersecting pair V2A0, V3B0 (or reciprocally V3A0, V2B0) intersect in their linear zones (but not at their center) for values of Vin equal to another fictitious intermediate voltage V'RA located in the middle of the half-interval VRM, VRA.

If the symmetrical pair of signals V1A0, V1B0 is applied to a new linear symmetrical differential amplifier, this amplifier will give a new pair of signals varying as a function of Vin monotonically, symmetrically, the curves of variation of these signals further intersecting at the center of their linear zones for Vin equal to the main reference voltage VRB. For the pair V2A0, V2B0, it is the same thing for Vin equal to VRM, and for the pair V3A0, V3B0, the curves intersect at their center for Vin equal to VRA.

If the intersecting pair V1A0, V2B0 is applied to a linear symmetrical differential amplifier, this amplifier will give a new pair of signals varying as a function of Vin symmetrically. The curves of variation of these signals intersect at the center of their linear zones (which was not the case for the curves V1A0, V2B0 themselves) for Vin=V'RB. Similarly, for the intersecting pair V2A0, V3B0 which, applied to a symmetrical linear differential amplifier, produces two signals whose curves of variation, which are monotonic and symmetrical intersect, at their center for Vin=V'RA.

The additional differential amplifiers just referred to may therefore be used to make five pairs of signals that may be called interpolation signals, of which:

three pairs are quite analogous to the output signals of the amplifiers A1, A2, A3 and the intersections of their curves of variation correspond to the three main voltage references VRB, VRM, VRA, two additional pairs are very similar to the three first pairs but their curves of variation are interposed in the middle of the other three pairs, their intersections occurring in one case for Vin=V'RA and in the other case for Vin=V'RB, namely for the two intermediate fictitious reference voltages.

We shall return further below to these curves of variation of the output signals of these additional differential amplifiers which, as can be seen, belong to an interpolation cell CI1, itself forming part of an interpolation and selection circuit CIS1 in a structure comprising several cascade-connected interpolation and selection circuits.

The range of reference voltages in which the five references are located is the range VRB, VRM, VRA that may be called a 0 order range divided into two 0 order half-intervals which are the half-intervals VRB, VRM and VRM, VRA.

According to the invention, within this 0 order range, a first-order range is selected that is twice as small, hence with a width equal to a 0 order half-interval, this first-order range having, as its ends, two of the five voltage references of the 0-order range and, as the middle, another of these five references.

There are three possibilities: range (VRB, VR'B, VRM); range (VR'B, VRM, VR'A); or range (VRM, VR'A, VRA).

The range that most closely surrounds the voltage Vin is chosen. This is possible by comparing the values of the three pairs of output signals from the amplifiers A1, A2, A3 with one another (detailed explanations shall be given further below on this comparison). The three ranges overlap, namely the center range straddles the other two.

Choosing one of three ranges is quite simply equivalent to selecting three pairs of signals out of five signals prepared by five differential amplifiers in the interpolation circuit CIS1.

The first-order interpolation circuit CIS1 therefore prepare five pairs of signals by means of an interpolation cell CI1 with five differential amplifiers but, at its output, it gives only three selected pairs which shall be called V1A1, V1B1; V2A1, V2B1; V3A1, V3B1. And the selected pairs are those corresponding to three reference voltages most closely surrounding the input voltage Vin.

A decision circuit CD1 is therefore associated with the cell CI1 to control the selection of three out of five pairs, the set CD1 and CI1 constituting the first-order interpolation circuit CIS1.

We have therefore prepared three pairs of signals whose curves of variation as a function of Vin have the same shape as the curves of the output signals of the three amplifiers A1, A2, A3 and intersect for three selected voltage references that shall now be called first-order main voltage references. These references are fictitious and, in the same way as the three real references VRB, VRM, VRA defined a 0-order voltage interval with an amplitude VRA-VRB, these three fictitious references define an interval of voltages or range of voltages of the first order which is half the 0-order range and centered as far as possible on the voltage Vin.

The interpolation circuit CIS1 is furthermore capable of providing information on the range of selected voltages (since it selects this range itself) and it is understood that this information (two bits for example to define the selection of one out of three ranges) may be used for the analog-digital conversion of Vin since it corresponds to a choice of range most centered on Vin. The digital information element thus obtained naturally corresponds to a coarse approximation of Vin, hence to a most significant value of conversion. An explanation will be given further below of how this information is used more precisely but as of now it can be stated that the range selection information is transmitted to a decoding circuit DEC which prepares the binary digital value B0, B1, ..., Bn of the analog-digital conversion of Vin.

All that remains to be done is to use the three pairs of output signals of the circuit CIS1 to apply them to a succession of other cascade-connected interpolation circuits CIS2, ..., $CIS_n$ that are identical to the circuit CIS1. Each circuit receives three pairs of signals, prepares five pairs of signals and selects three pairs of signals for the next circuit. At each time, the three pairs of signals have the same shape as FIG. 4, namely:

their curves of variation along Vin are monotonic, the curves of signals of a pair are symmetrical and intersect therefore at their center, defining a main reference, the three pairs defining three main references, the curves of the signals of a pair intersect the curves of the signals of the closest pair in their linear zones, in defining two intermediate references, the curves of the three pairs are more closely packed together, with spacings reduced each time by half as compared with the spacing between the curves in the previous stage, and Vin is always located in the range defined by the three main references, a range which narrows down at each new stage.

Consequently, a k order interpolation and selection circuit $CIS_k$ receives three pairs of signals $V1A_{k-1}$, $V1B_{k-1}$, $V2A_{k-1}$, $V2B_{k-1}$, $V3A_{k-1}$, $V3B_{k-1}$. The pairs of signals vary as a function of Vin according to symmetrical monotonic curves which intersect at the center of their linear zones for three k−1 order main reference voltages defining a k−1 order range. The circuit $CIS_k$ prepares five pairs of signals, selects three of them which are the signals $(V1A_k, V1B_k)$, $(V2A_k, V2B_k)$, $(V3A_k, V3B_k)$.

It will be noted that the three pairs of output voltage selected have curves of variation as a function of Vin that all intersect in a linear zone of these curves. This makes it possible, in the following stage, to use these signals to obtain other interpolation voltages defined with precision.

The circuit $CIS_k$ furthermore provides information elements (in principle two bits) on the range of voltages selected for the k order and these information elements are transmitted to the decoder DEC.

There is no 0-order circuit other than the amplifiers A1, A2, A3 and the first-order circuit therefore directly receives the outputs from the amplifiers A1, A2, A3. The last n-order interpolation circuit, through a comparator $CMP_n$, may give an information bit on the position of Vin with respect to the median voltage reference of the group of n-order main reference voltages. This information element is obtained by comparing the output signals $V2A_n$ and $V2B_n$ of the n-order circuit $CIS_n$. It is transmitted to the decoder DEC which has need thereof to prepare the digital value (B0, B1, ..., $B_n$) of Vin.

Since the converter consists of a cascade of interpolation circuits, the range selection logic must work sequentially from one stage to the next one, the preparation of a k order range having no meaning unless the k−1 order range has been chosen beforehand. The converter therefore works under the control of a sequencer and the clock signals applied to a k order stage are delayed by a short instant, by a delay circuit $R_k$ as compared with the clock signals applied to the previous stage. These delay circuits (R1, R2, ..., Rn) are shown in FIG. 1.

Figure 5:
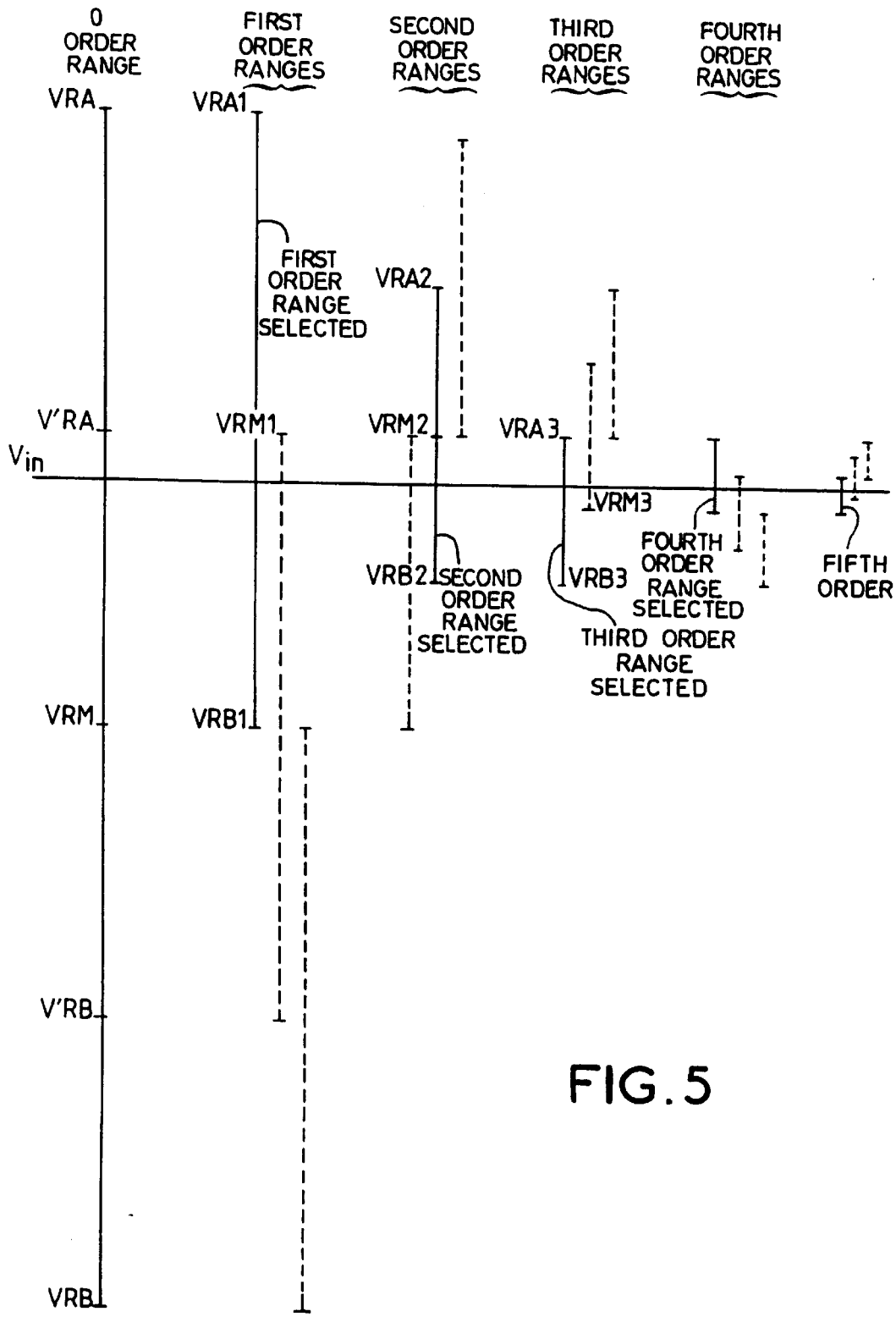
FIG. 5 is an explanatory drawing of the principle of successive approximation of Vin by the selection of ranges of voltage.

FIG. 5 is an explanatory graph providing a broadly descriptive illustration of the notion of ranges of successive amplitude voltages reduced by half, a k order range being subdivided into three overlapping k−1 order ranges, among them a k+1 order range chosen because it most closely surrounds the voltage Vin.

FIG. 5 provides a symbolic illustration of the principle of selection of decreasing ranges around Vin, on which the cascade architecture of FIG. 1 is based.

Vin is located at the outset in the range of voltages VRB, VRM, VRA shown in a vertical scale in FIG. 5. If Vin is not in this range, the comparator CMPX or CMPY indicates this fact.

The range VBM, VRM, VRA is the 0-order range formed by two 0-order half-intervals: VRB, VRM and VRM, VRA.

The use of three pairs of signals coming from the amplifiers A1, A2, A3 enables the definition, as explained here above, within the first-order circuit CIS1, of five fictitious reference voltages (three main voltages which are VRB, VRM and VRA and two intermediate references V'RB, V'RA located in the middle of the half-intervals VRB, VRM and VRM, VRA.

These five references define three first-order voltage ranges, each of which has an amplitude that is half of the 0-order range, which overlap mutually and include two first-order half-intervals with an amplitude half of the 0 order half-intervals.

These voltage ranges overlap and the voltage Vin may be located within one or two of these ranges. However, it is surrounded more closely by one range (the range whose middle is closest to Vin).

One function of the interpolation and selection circuit and more specifically one function of the associated decision circuit is to select that range which most closely surrounds Vin. In FIG. 5, it is the range (VRM, VRA) with an intermediate reference V'RA in the middle.

This range is the first-order range selected and, for the consistency of notation, the references $VRB_1$, $VRM_1$, $VRA_1$ may be applied to the three first-order main fictitious order references that it defines for the following second-order interpolation circuit.

These three main first-order voltages are theoretically VRM, VR'A and VRA but, owing to linearity errors, it may be that the fictitious reference voltages defined by the interpolation circuit are not strictly equal to the 0-order references and this is why the first-order references have been called VRB1, VRM1, VRA1.

This selection of one out of three ranges corresponds, in practice, within the first-order interpolation and selection circuits CIS1, to the selection of three pairs of signals out of five pairs prepared in this circuit, the three selected pairs constituting the output of the circuit CIS1 and being applied to the input of the circuit CIS2.

In the same way, from the three pairs of signals applied to the second-order circuit CIS2, it is possible to establish five pairs of signals and select three pairs of second-order output signals, $V1A_2$, $V1B_2$, $V2A_2$, $V2B_2$, $V3A_2$, $V3B_2$, corresponding to a second-order voltage range with an amplitude half that of the first-order voltage range divided into two half-intervals identified by the voltage references $VRB_2$, $VRM_2$, $VRA_2$, the selected range being that which most closely approaches Vin.

Continuing in this way, ranges are chosen that are increasingly restricted around Vin.

The choice of the most appropriate range for the k order is done by the decision circuit CDk associated with the k order interpolation cell Clk. This decision circuit takes the decision as a function of the value of the voltages applied to the input of the k order circuit.

The overlapping of the ranges is used to limit the necessary precision for the decision circuits: this precision does not need to be of the same order as the conversion precision of the converter.

Figure 6:
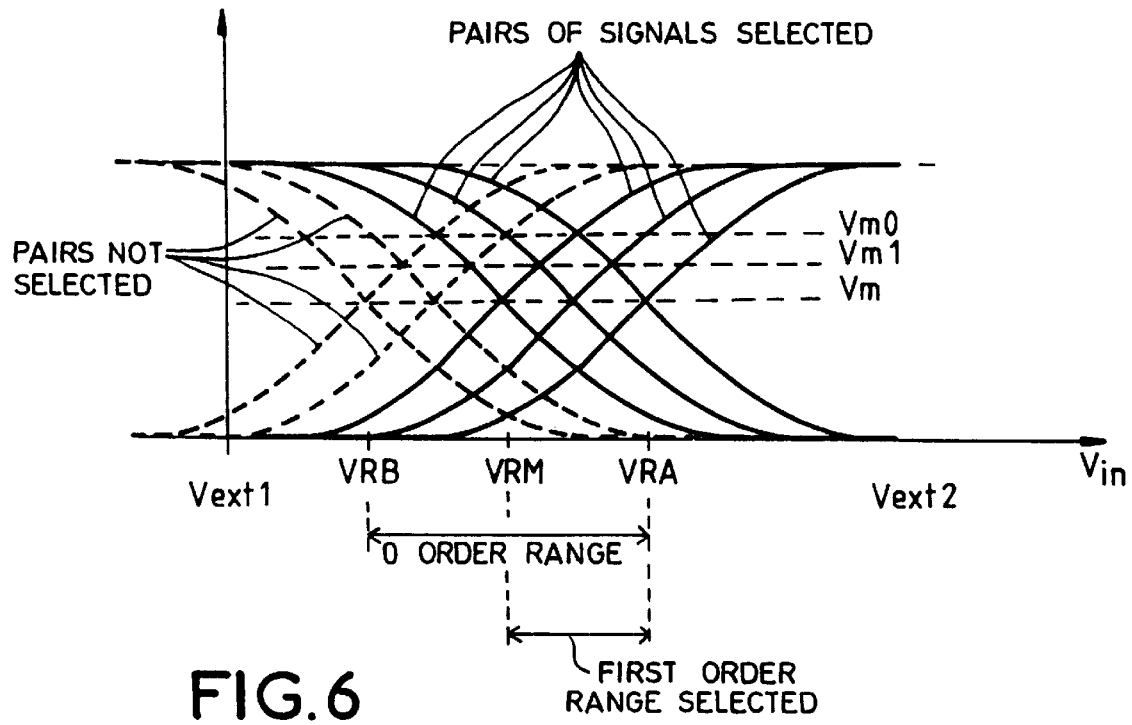
FIG. 6 shows the curves of variation of the output signals from the first-order interpolation and selection circuit, with the other signals that are prepared in this circuit but not selected.

FIG. 6 shows the five pairs of signals that are prepared in the interpolation circuit CIS1, of which three (in solid lines) are selected because they define a first-order range that most closely surrounds Vin and two (in dashes) are unused because they are serve solely to define the two unselected ranges.

The five pairs of signals have curves of variation (as a function of Vin) similar to those of FIG. 4.

Although the curves of FIG. 6 have been shown with slopes of variation (at the intersections) identical to those of FIG. 4, it can be observed that the slopes may be different without changing the principle of operation. More generally, the slope of variation of the signals of one stage as a function of Vin is not necessarily the same as the slope of variation of the signals of the previous stage as a function of Vin. Preferably, it is twice as great. This point shall be examined further below.

Figure 7:
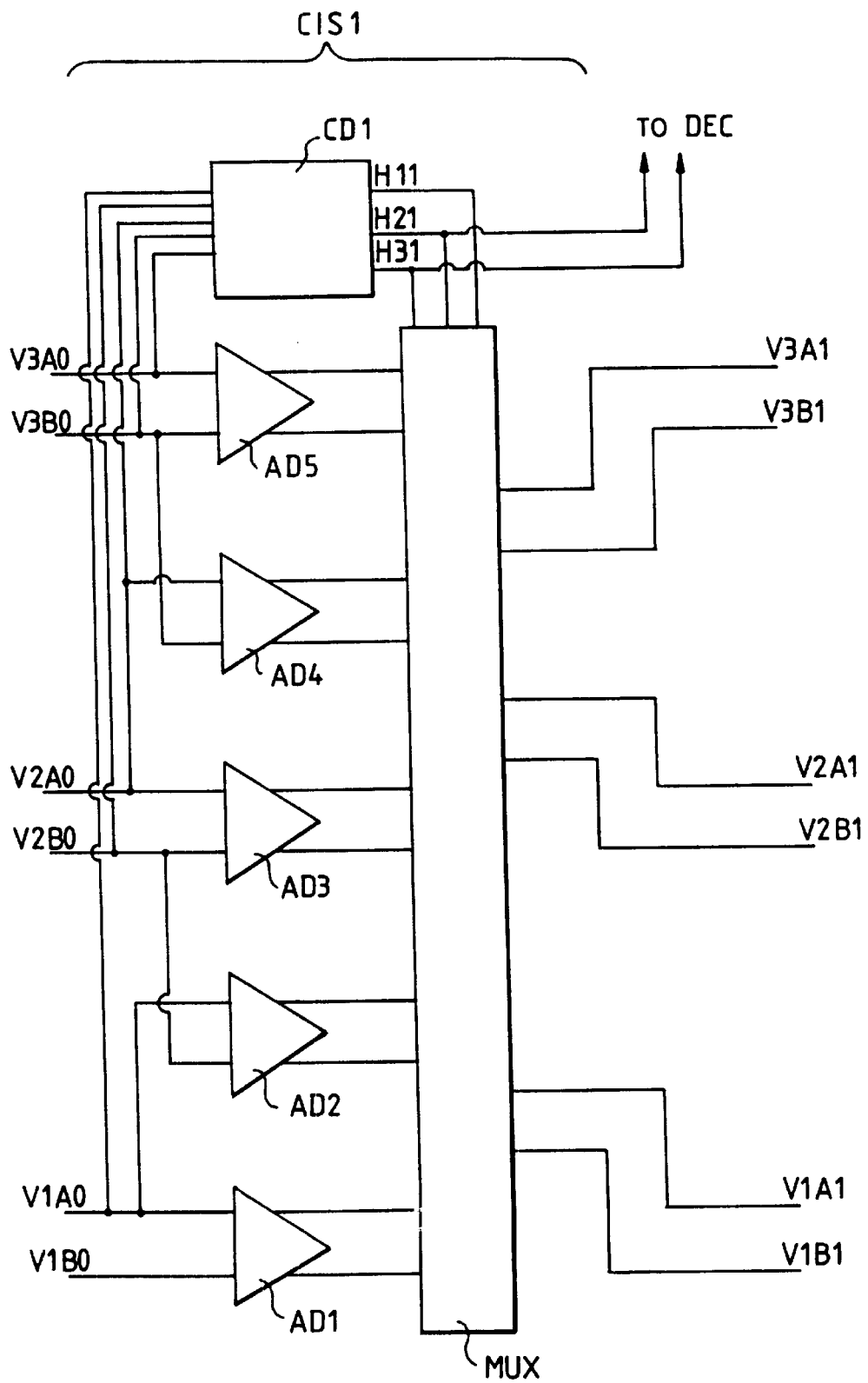
FIG. 7 shows the general configuration of an interpolation and selection circuit such as the circuit CIS1 of FIG. 1.

FIG. 7 shows the schematic structure of an interpolation and selection circuit, for example the first-order circuit CIS1, the others possibly being identical.

The circuit has five differential amplifiers AD1, AD2, AD3, AD4, AD5. The amplifiers may be of the type shown in FIG. 2 or of a type that is improved from the viewpoint of linearity like that of FIG. 8 since linearity is a major factor of precision in the structure of the invention.

The amplifiers AD1, AD3, AD5 receive, at input, the pairs of symmetrical signals V1A0, V1B0; V2A0, V2B0; V3A0, V3B0 respectively. The amplifiers AD2 and AD4 receive intersecting pairs V1A0, V2B0 and V2A0, V3B0 respectively.

They produce five pairs of signals applied to a multiplexer MUX which selects three of them under the control of the decision signal CD1. The three pairs of selected signals are signals called V1A1, V1B1; V2A1, V2B1; V3A1, V3B1. They are applied as input signals to the following stage The decision circuit CD1 receives the input signals V1A0, V1B0, V2A0, V2B0, V3A0, V3B0 (or only some of them given that they form symmetrical pairs) and it prepares logic signals $H1_1$, $H2_1$, $H3_1$ and possibly their complements. These signals control the multiplexer MUX: the signal $H1_1$ is at the high logic level if the lower voltage range is selected; the signal $H2_1$ is at the high logic level if it is the intermediate range that is selected; and the signal $H3_1$ is at the high level if it is the higher range that is selected.

The signals prepared by the circuit CD1, in this case more specifically the signals $H2_1$ and $H3_1$, furthermore constitute binary logic information elements given to the decoder DEC of FIG. 1 to prepare the digital value of Vin.

In the same way, a k order circuit CISk generates selection signals $H1_k$, $H2_k$, $H3_k$, of which the signals $H2_k$ and $H3_k$ are transmitted to the decoder DEC.

Figure 8:
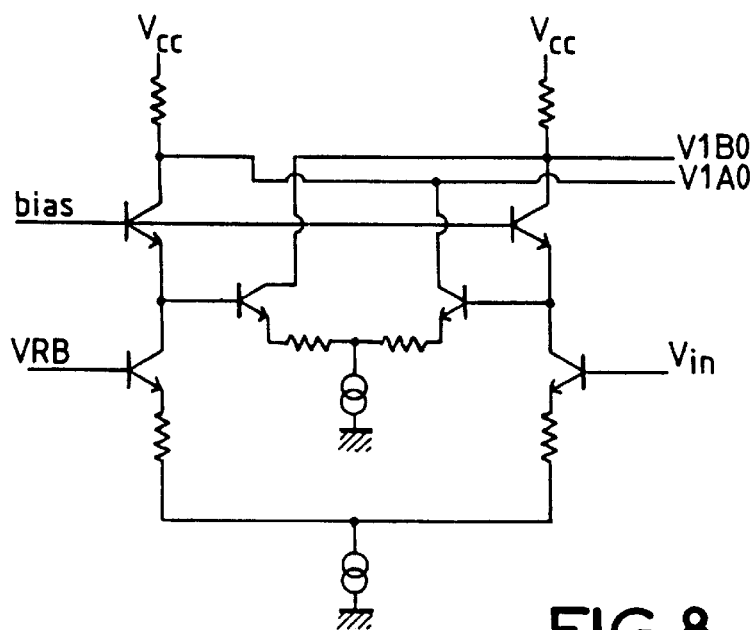
FIG. 8 is a drawing of a differential amplifier with improved linearity used in the invention.

FIG. 8 shows a possible constitution of the amplifiers AD1 to AD5 or amplifiers A1, A2, A3 with the insertion in the main differential arms of cascode transistors (with their bases connected to a common fixed potential) and the addition to the output of two additional differential arms intersecting with respect to the main arm. This type of amplifier is known to have high linearity on a wide range of input voltages.

Figure 9:
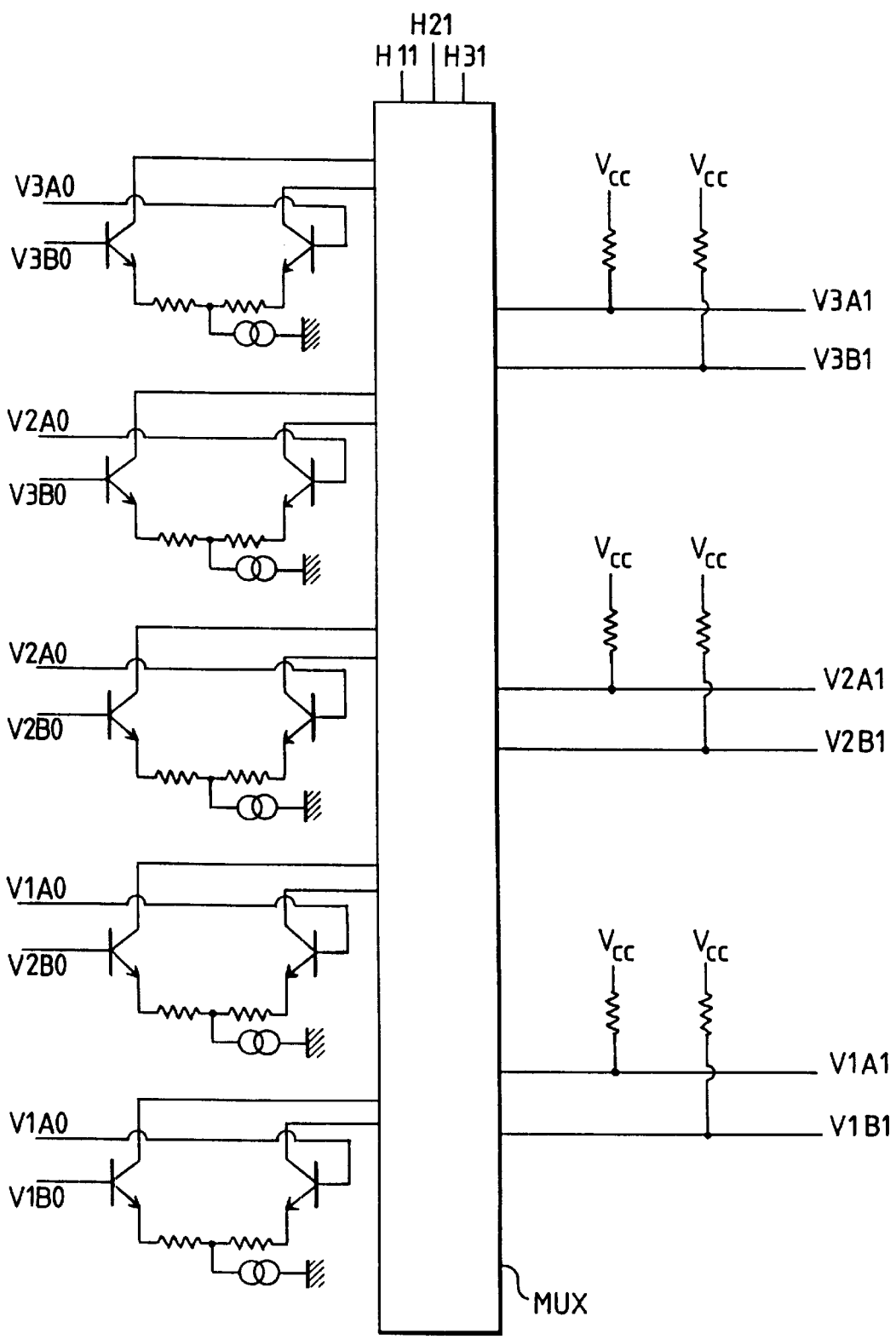
FIG. 9 shows a practical drawing of a circuit for the selection of three pairs of signals out of five pairs themselves prepared from three pairs of input signals.

FIG. 9 shows an exemplary practical embodiment of the interpolation circuit CI1 with its five differential amplifiers and its multiplexing circuits. In this example, the differential amplifier proper is that of FIG. 2 but the load resistors connected to the collectors of the transistors are separated from these collectors, namely the multiplexing circuits are interposed between the transistors and the load resistors.

This makes it possible to have five pairs of transistors with three pairs of load resistors only. The role of the multiplexer is to connect the three pairs of load resistors to three pairs of transistors selected from among the five transistors. The collectors of the other transistors are then connected to the supply voltage Vcc.

The diagram of FIG. 9 must of course be modified if the amplifiers of the type shown in FIG. 8 are used. The cascode transistors and the additional differential pairs are then connected to the three pairs of load resistors at the output of the multiplexer.

The gain of the differential amplifiers of the interpolation circuits is preferably equal to 2 (with a gain in output differential voltage over input differential voltage). To explain this choice, we shall first of all return to FIGS. 4 and 6.

FIG. 6 shows the signals produced by the five differential amplifiers of the interpolation circuit CIS1. These signals have been shown with the same slope (as a function of Vin) as the input signals of this stage, namely the signals V1A0, V1B0, etc. shown in FIG. 4. This would correspond to the case where the differential amplifiers of the circuit CIS1 have a unit gain.

In this case, it can easily be seen that the voltage levels of intersection of the variation curves are not constant from one stage to the next one: for example, the adjacent intersecting pairs at the output of the amplifiers A1, A2, A3 intersect for a voltage Vm0. The adjacent intersecting pairs at the output of the circuit CIS1 intersect for a voltage Vm1 such that (Vm1–Vm) is twice as small as (Vm0–Vm). The adjacent intersecting pairs at the output of the next stage CIS2 intersect for a voltage Vm2 such that (Vm2–Vm) is two times smaller than (Vm1–Vm), etc.

Transistors of the amplifiers of the different stages therefore do not work under the same conditions.

It is therefore preferred to increase the slope of the curves of variation as a function of Vin from one stage to the next one to raise the level of intersection each time to roughly the same level Vm0. This may be obtained easily by providing for a gain of about two for the differential amplifiers of the different interpolation circuits.

Figure 10:
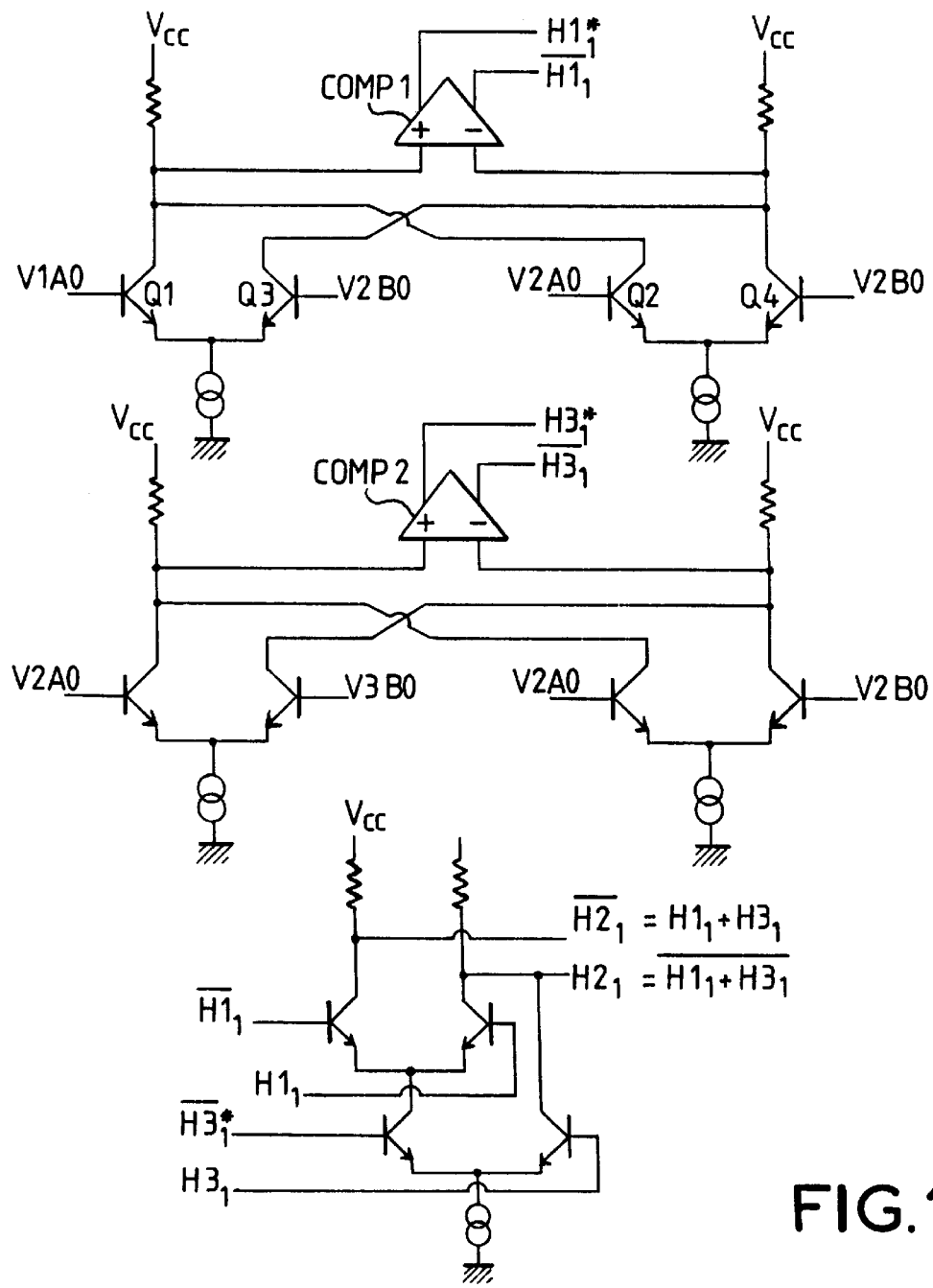
FIG. 10 shows a decision circuit enabling the selection of three out of five pairs of signals.

The decision circuit CD1 is shown in detail in FIG. 10. It produces logic signals $H1_1$, $H2_1$, $H3_1$ from analog additions between some of the input signals V1A0, V1B0, V2A0, V2B0, V3A0, V3B0. These signals depend on Vin and their sums depend on Vin (except for the sum of the signals of one and the same pair).

Figure 11:
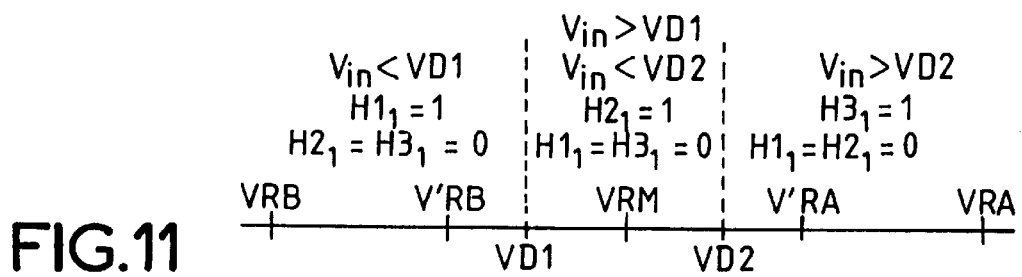
FIG. 11 shows a graph of voltages explaining the logic basis of the decision circuit of FIG. 10.

If reference is made first of all to FIG. 11 to explain the principle of the decision circuit, the following may be observed: to find out which is the best of the three ranges of first-order voltage to be selected (the one that most closely surrounds Vin) when the reference voltages are VRB, VR'B, VRM, V'RA and VRA, it is necessary to determine the position of Vin with respect to the voltages VD1 and VD2 respectively located in the middle of the half-intervals (V'RB, VRM) and (VRM, V'RA).

Indeed, if Vin is below VD1 it is the lower range VRB, VRM that must be selected for Vin is closer to the middle of this range than to the middle of the other ranges. If Vn ranges from VD1 to VD2; it is necessary to select the center range V'RB, V'RA for Vin is closer to the middle of this range than to the middle of the other ranges. And if Vin is greater than VD2, it is necessary to select the higher range VRM, VRA.

Now, to compare Vin with VD1 and VD2 when the signals available are not directly VD1 and VD2 but only input signals from the circuit CIS1, it is possible to combine certain of these input signals in differential amplifiers acting as algebraic summators.

Thus, the circuit that prepares the comparison of Vin with VD1 (upper part of FIG. 10) is formed by a dual pair of intersecting differential arms using two common load resistors. The four transistors of this dual pair receive, as input voltages, the voltage V1A0 and V210 (transistor Q1 and Q2 connected to one of the load resistors) and V2B0 (transistors Q3 and Q4 connected to the other load resistor). The two outputs of this differential dual pair go to a comparator COMP1 delivering the logic signal $H1_1$ and its logic complement. The dual differential pair indeed produces a signal whose variation with Vin is monotonically increasing, negative when (V2B0–V2A0)+(V2B0–VLA0) is negative and then positive when (V2B0–V2A0)+(V2B0–V1A0) is positive.

Now, if the curves of FIG. 4 are examined, it is easy to see that the above algebraic sum gets cancelled when Vin goes through the middle of the interval V'RB, VRM, hence by VD1. The comparator COMP1 therefore switches over when Vin becomes greater than VD1.

Similarly, $H3_1$ is produced by a similar circuit receiving V2A0, V2B0 and V3B0 and giving, at the output of comparator COMP2, the signal $H3_1$ and its complement which switch over when Vin becomes greater than VD2. Finally, a logic adder sets up $H2_1$ which is the logic complement of the sum $H1_1+H3_1$ and represents the fact that Vin is located or not located between VD1 and VD2.

Finally, as shown in FIG. 11, the logic signal $H1_1$ is a level 1, representing the lower range selection (VRB, VRM) when Vin is smaller than VD1, and at a level 0 when Vin is greater than VD1. The logic signal $H2_1$ is at a level 1, representing the selection of the central range (V'RB, V'RA) when Vin ranges from VD1 to VD2, and at a level 0 when Vin is beyond this interval. And the signal $H3_1$ is at a level 1, representing the selection of the higher range (VRM, VRA) when Vin is greater than VD2, and at a level 0 if not.

For the other interpolation and selection circuits, it is the same: the signals $H1_k$, $H2_k$, $H3_k$ for the k order circuit represent the three possible k order range selections.

The range selection signals $H1_k$, $H2_k$, $H3_k$ are used by the decoder DEC (FIG. 1) to determine the digital value of Vin.

The meaning of this decoding is as follows. Given the overlapping of the ranges, the value of the signals $H1_k$, $H2_k$, $H3_k$ does not directly determine a range of values of Vin. The information has an unambiguous meaning if the k order higher range or k order lower range is selected ($H2_k=0$), but it is ambiguous if it is the k order central range that is selected ($H2_k=1$).

In the latter case, the k+1 order range selection removes this ambiguity unless it is still the central range that is selected. Continuing in this way, by using the combination of the information of k order range selection and the information of k+1 order range selection, the ambiguity is removed as regards the range in which Vin is located. For the last n order, if it is the central range that is selected, the ambiguity (which relates only to one least significant bit of the analog-digital conversion) is removed by comparing the output signals V2An and V2Bn of the n order interpolation circuit CISn (comparator CMPn of FIG. 1). This comparison indicates whether Vin is closer to the lower range or closer to the higher range even if Vin is in the central range.

The principle of the decoder DEC is then as follows: the most significant bit B0 of the conversion is 1 if $H3_1$ is equal to 1 for Vin is then greater than VD2. The most significant bit B0 is zero if $H3_1$ and $H2_1$ are equal to zero (which is equivalent to $H1_1=1$), for then Vin is lower than VD1. However, if $H3_1$ is equal to zero and $H2_1$ is equal to 1, there is ambiguity and this ambiguity can be removed only by examining $H3_2$.

The bit B0 can therefore be obtained by the addition of $H3_1$ and a bit that itself depends on $H3_2$ and $H2_1$ in furthermore noting that the addition of $H3_2$ and $H2_1$ itself, provided that there is an ambiguity when $H3_2=0$ and $H2_2=1$, gives the bit with a place value immediately below that of B1.

Figure 12:
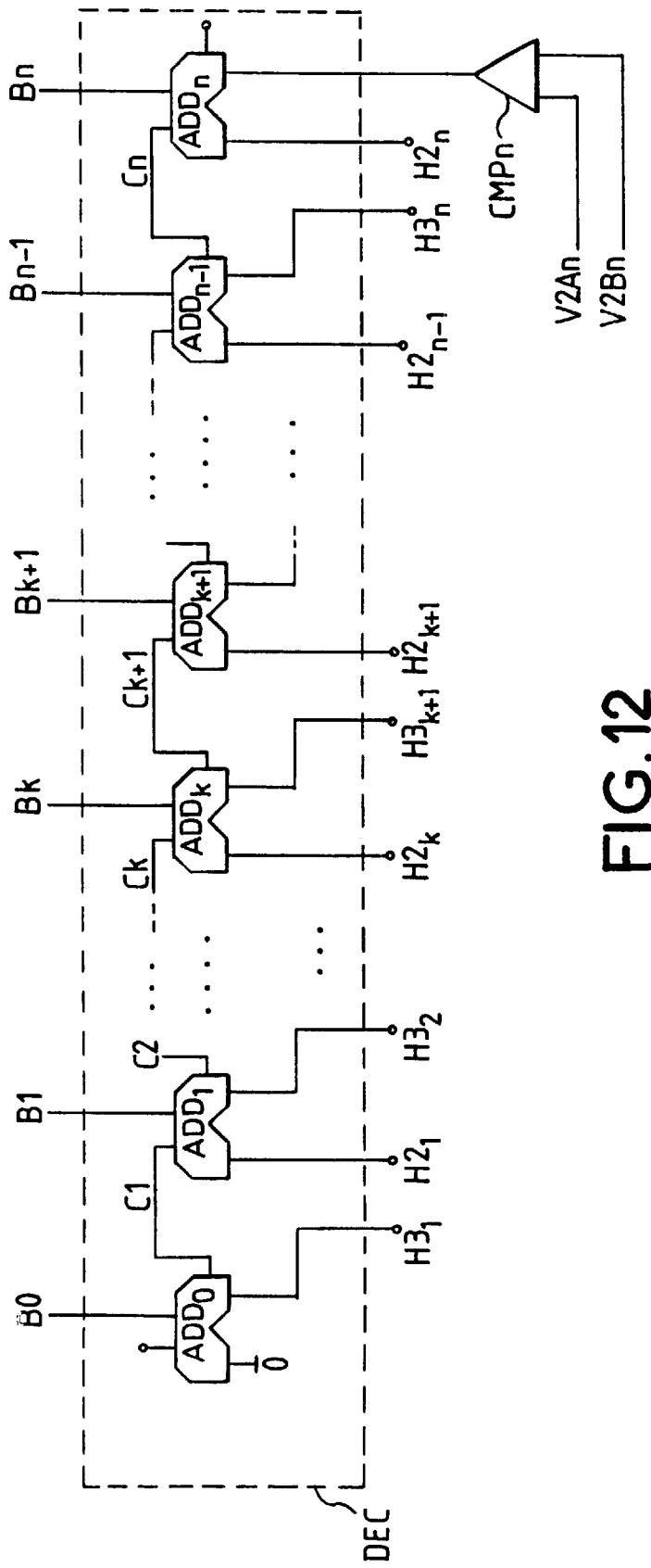
FIG. 12 shows a decoder structure made from cascade-connected adders to obtain a digital value of Vin.

The structure of the decoder proposed herein shown in FIG. 12 therefore comprises:

a most significant value adder ADD0 that receives $H3_1$ and the carry value C1 of an adder ADD1 of an immediately lower place value, and that gives B0;

an adder ADD1 that receives $H2_1$ coming from the decision circuit CD1 and $H3_2$ coming from the decision circuit CD2, and the carry value C2 of a following adder ADD2, and that gives the bit B1 of the conversion and the carry value C2;

and so on, an adder ADDk, receiving $H2_k$ and $H3_{k+1}$ and the carry value $C_{k+1}$ of the following adder and giving the bit $B_k$ of the conversion and a carry value $C_k$;

and for the last n-order stage, an adder ADDn receiving $H2_n$ and a final ambiguity removal bit coming from the output of the comparator CMPn, this adder giving the bit Bn of the conversion and a carry value Cn for the previous stage.

The final removal of ambiguity, for the least significant bit, is indeed done by means of the level of Vin with respect to the median main voltage reference prepared by the last interpolation circuit CISn and its comparison is given by the comparator CMPn which receives the signals V2An and V2Bn.

Thus, a complete description of the circuit of FIG. 1 has been given in a preferred embodiment. It will be noted that alternative embodiments can be planned without departing from the context of the invention and these variants shall now be described.

First of all, it will be noted that the circuit as a whole may be made by means of MOS technology, namely by the exclusive use of insulated-gate field-effect transistors instead of bipolar transistors. There are indeed known ways of making linear differential amplifiers by MOS technology.

Then, the analog to digital converter may comprise only two or three stages of interpolation circuits such those described here above. The least significant values of the conversion may indeed be obtained by cascade-connected interpolation circuits of the prior art, or by yet other means. Similarly, the most significant values (with values more significant than B0) may be, as already recalled, obtained from fast, coarse converters.

Furthermore, the interpolation and selection circuits described in detail in the preferred exemplary embodiment include five differential amplifiers and use a multiplexer to select three pairs of signals out of five. But it is possible, in order to reduce the number of cascade-connected stages slightly at the cost of the slightly greater complexity of these stages, to provide for a pattern where one or more of these interpolation and selection circuits include a greater number of differential amplifiers and enable the selection of three pairs of signals out of $2^p+1$.

In practice, p may be equal to 3 (there would be p=2 in the example described here above). This means that, with three pairs of input signals, nine pairs of signals are created, each corresponding to a fictitious reference voltage, and three adjacent references are selected defining an interval that most closely surrounds Vin. These three references are used to define three pairs of output signals which shall be applied as inputs to the next stage.

Figure 13:
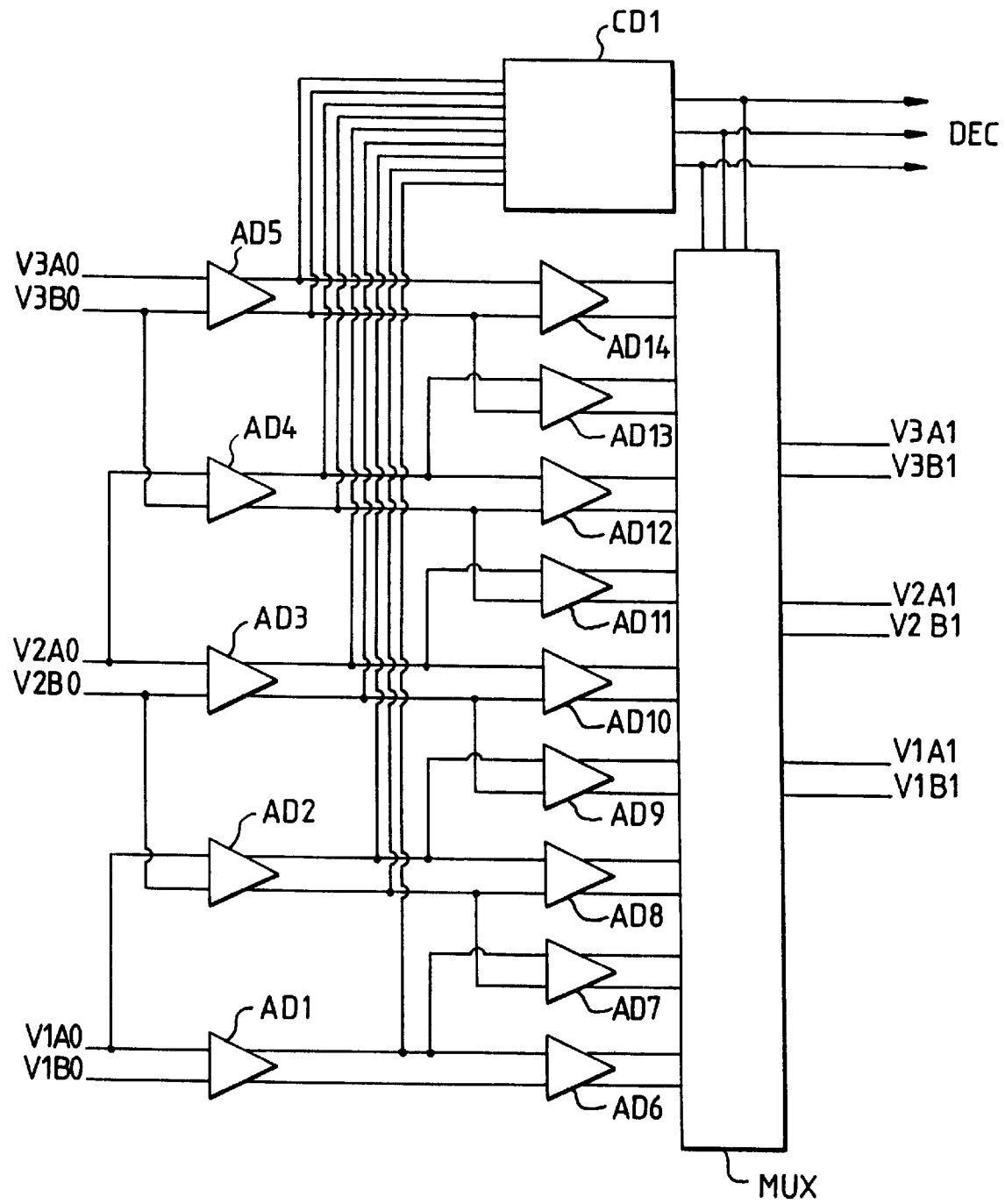
FIG. 13 shows an alternative embodiment of an interpolation and selection circuit used for the selection of three out of nine pairs of signals for the selection of one out of seven sub-ranges.

FIG. 13 shows the general architecture of an interpolation and decision circuit that works with p=3.

This circuit has two successive amplification stages and a single multiplexer (MUX) at output of the second stage to select three out of nine pairs. The first stage has five amplifiers (AD1 to AD5) similar to those of FIG. 7. These amplifiers receive the three non-intersecting pairs of input signals and two intersecting pairs, as explained with reference to FIG. 7. The second stage has nine amplifiers AD6 to AD14 and receives the five non-intersecting pairs coming from the first stage and four intersecting pairs also coming from the first stage. The gains of the amplifiers AD1 to AD14 are preferably gains by a factor of about 2. The nine amplifiers of the second stage produce pairs of monotonic symmetrical signals which define nine fictitious voltage references evenly spaced out in an interval whose boundaries are the main references defined by the three pairs of input signals. The decision circuit CD1 chooses three of these nine references, hence three pairs of these output signals out of nine possible pairs. The three fictitious references thus chosen, which become main references for the next stage and whose interval is four times smaller than the interval between the main reference voltages defined by the input signals, are those that most closely surround the input voltage Vin. The decision circuit which enables the choice of these three out of nine references performs analog subtractions and comparisons from the five pairs of input signals of the second stage, according to the principle explained with reference to FIGS. 10 and 11 to set up logic signals (three bits for seven possibilities) indicating the selection made. These logic signals are directly related to the range in which Vin is located and may be decoded to give an indication on the digital value of Vin. The drawing of FIG. 7 reduces the number of cascade-connected stages since a range of k order voltages has an amplitude four times smaller than a k−1 order range, but this of course is done at the cost of greater complexity for each stage.

Finally, if the general architecture of the converter as shown in FIG. 1 is looked at again, it is seen that there are one or more cascade-connected interpolation circuits each giving three pairs of analog signals at its output. It is then possible to use the three pairs of signals of the last stage to apply them to another type of interpolation circuit capable of accepting three pairs of input signals. More specifically, a detailed explanation has been given in the Pat. U.S. Pat. No. 5,471,210 or FR 2 699 025 of the making of a cascade-connected interpolation circuit whose first stage receives three pairs of analog signals and mixes them to produce two pairs of analog signals which may be applied to other cascade-connected interpolation stages having two pairs of inputs and two pairs of outputs. At each stage, two pairs of signals are produced. When Vin is made to vary, these two pairs of signals vary in phase opposition with intersections either for main reference voltages or for intermediate reference voltages located in the middle of the interval between two main reference voltages. The intermediate reference voltages set up at the output of a stage become main voltages at the input of the next stage.

It is therefore possible to imagine a circuit comprising k stages CI1 to CIk such as the one of FIG. 7. Then, one or more stages are placed at the output of the k order circuit corresponding to what was stated in the above paragraph. The three pairs of signals selected at output of the k order interpolation selection circuit are connected to the input of a k+1 order interpolation circuit. This k+1 order circuit gives four k+1 order interpolation voltages that are variable, as a function of the voltage Vin, in reverse in sets of two. Two of them pass through a mean value while, of the other two voltages, one has a maximum while the other has a minimum when the voltage Vin is equal to any one of the three k order main reference voltages. A k+1 order comparator is planned to receive these other two voltages and give a logic signal indicating the highest voltage, and this logic signal is used to define an information bit on the digital value of Vin, with respect to k+1 order reference voltages located between the k order references.

If the operation is continued with another cascade-connected stage as explained in the above-mentioned patents, this other k+2 order stage receives four k+1 order interpolation voltages and itself produces four k+2 order interpolation voltages that are variable as a function of Vin, in reverse in sets of two. Two of them pass through a common mean value when the voltage to be converted is equal to values of k+1 order main reference voltages, and one of them passes through a maximum while the other passes through a minimum when the voltage Vin to be converted is equal to the k and k+1 order reference voltages. The other two k+2 order interpolation voltages go through a common mean value when the voltage Vin is equal to a k order or k+1 order reference voltage. A comparator receives the two voltages in phase opposition from the k+2 order interpolation circuit. These two voltages in phase opposition go through a maximum or a minimum when Vin is equal to the k and k+1 order reference voltages. This comparator gives a logic signal indicating which of these two voltages is the highest, thus defining an additional information bit on the value of Vin with respect to a k+2 order reference voltage located between the k+1 order voltages.

What is claimed is:

1. An analog to digital converter that possesses an input to receive an analog voltage Vin to be converted, wherein said converter comprises a succession of cascade-connected interpolation and selection circuits with at least one k order interpolation and selection circuit comprising:

three pairs of inputs receiving, as input signals, three pairs of output signals from a k−1 order interpolation and selection circuit, the signals of a pair having equal values when the voltage to be converted Vin is equal to one of the three k−1 order main reference voltages, these three voltages mutually defining an interval consisting of two k−1 order voltage half-intervals, means for the setting up, from the input signals, of five pairs of signals known as interpolation signals, each pair comprising two interpolation signals that vary symmetrically and monotonically as a function of the voltage Vin, the signals of one pair being equal when the voltage Vin is equal to a reference voltage associated with this pair, the five reference voltages associated with the five pairs being substantially, firstly, the three k−1 order main reference voltages and, secondly, two intermediate reference voltages located in the middle of the half-intervals defined by the three k−1 order main reference voltages, these five reference voltages being used to define three voltage intervals of a width equal to one of the k−1 order half-intervals, decision means to determine which of the five reference voltages are the three voltages that mutually define an interval with a width equal to a k−1 order half-interval and that most closely surround the input voltage Vin to be converted, the reference voltages thus selected being three k order main reference voltages, and means for the selection, from the five pairs of interpolation signals, of the three pairs such that the signals of one pair are equal when the voltage Vin is equal to one of the k order main reference voltages.

2. A converter according to claim 1, wherein the first-order interpolation and selection circuit receives, as input signals, the differential outputs from three differential amplifiers which receive the voltage Vin to be converted at a first input, each of them receiving, at a second input, one of three primary voltage references, these amplifiers each giving two output voltages that vary symmetrically and monotonically as a function of the voltage Vin to be converted.

3. A converter according to claim 2, wherein the primary voltage references are spaced out with respect to one another so that the variation curves of output voltages from the amplifier corresponding to the central reference intersect the variation curves of the output voltages from the two other amplifiers in a zone of linear variation of these output voltages.

4. A circuit according to any of the claims 1 to 2, wherein the k order interpolation and selection circuit comprises five differential amplifiers, one decision circuit and one selection circuit controlled by the decision circuit for the orientation, to the outputs of the circuit, of the output signals from three differential amplifiers selected from among the five amplifiers.

5. A converter according to any one of the claims 1 to 3, wherein the three pairs of selected output voltages have curves of variation as a function of Vin that intersect in a linear zone of these curves.

6. An analog to digital converter according to any one of the claims 1 to 3, comprising a decoding circuit receiving logic signals coming from decision means of the interpolation and selection circuits to provide digital bits representing a digital value of Vin.

7. A converter according to claim 6, wherein the decoding circuit comprises at least one k order adder giving a k order conversion result bit and receiving, as inputs, one bit of a decision logic signal from a k order interpolation circuit, another bit of a decision logic signal coming from a k+1 order interpolation circuit and an addition carry value from a k+1 order adder.

8. An analog to digital converter that possesses an input to receive an analog voltage Vin to be converted, said converter comprising a succession of cascade-connected interpolation and selection circuits with at least one k order interpolation and selection circuit comprising:

three pairs of inputs receiving, as input signals, three pairs of output signals from a preceding interpolation circuit, the signals of a pair having equal values when the voltage Vin is equal to one of the three k−1 order main reference voltages each associated with a respective pair, these three voltages mutually defining an interval consisting of two k−1 order voltage half-intervals, means for the setting up, on the basis of the input signals, of $P=2^p+1$ pairs of interpolation signals (p>1, P>3), each pair comprising two interpolation signals that vary symmetrically and monotonically as a function of the voltage Vin, the signals of one pair being equal when the voltage Vin is equal to a reference voltage associated with this pair, the P reference voltages associated with the P pairs being substantially, firstly, the three k−1 order main reference voltages and, secondly, (P−3) intermediate reference voltages, the P reference voltages enabling the definition of $2^p-1$ voltage intervals with a width equal to $\frac{1}{2}^{p-1}$ interval corresponding to the k−1 order, decision means for the determining, as a function of the levels of the three pairs of input signals, of that voltage interval, among the $2^p-1$ intervals, that most closely surrounds the input voltage Vin, this interval consisting of two half-intervals demarcated by three out of P reference voltages, these three voltages being called k order reference voltages, and means for the selection, from among the P pairs, of the three pairs associated with the three k order reference voltages, to apply them to the output of the k order interpolation circuit.

9. An analog to digital converter according to claim 8, wherein the means for setting up interpolation signals comprise at least one parallel-connected differential amplifier stage, these amplifiers each having a gain of about 2.

10. A method for the analog to digital conversion of an input voltage Vin using several cascade-connected interpolation circuits wherein:

there are applied, to the input of a k order interpolation circuit, three pairs of analog signals coming from three outputs of the preceding k−1 order interpolation circuit, the signals of a pair having equal values when the voltage Vin is equal to one of three k−1 order main reference voltages each associated with a respective pair, these three voltages mutually defining an interval formed by two k−1 order voltage half-intervals, there are produced, from these three pairs of signals, $P=2^p+1$ pairs of interpolation signals (p>1, P>3), each pair comprising two interpolation signals that vary symmetrically and monotonically as a function of the voltage Vin, the signals of a pair being equal when the voltage Vin is equal to a reference voltage associated with this pair, the P reference voltages associated with the P pairs being substantially, firstly, the three k−1 order main reference voltages and, secondly, at least two intermediate voltages located in the middle of the half-intervals defined by the three k−1 order main reference voltages, these P reference voltages enabling the definition of $2^p-1$ voltage intervals with a width equal to $\frac{1}{2}^{p-1}$ interval corresponding to the k−1 order, an operation is carried out to determine, as a function of the levels of the three pairs of input signals, that voltage interval, of the $2^p-1$ intervals, that most closely surrounds the input voltage Vin, this interval being formed by two half-intervals demarcated by three out of P reference voltages, these three voltages being called k order reference voltages, a selection is made, among the P pairs, of the three pairs associated with the three k order reference voltages, and these three pairs are applied to the output of the k order interpolation circuit.

11. An analog to digital converter according to any one of the claims 1, 2, 3, 8, or 9 wherein the three pairs of selected signal at output of the k order interpolation and selection circuit are connected to the input of a k+1 order interpolation circuit giving four k+1 order interpolation voltages that are variable as a function of the voltage Vin, in reverse in sets of two voltages, two of them passing through a mean value and, of the other two voltages, one showing a maximum while the other shows a minimum when the voltage Vin is equal to any one of the three k order main reference voltages, a k+1 order comparator being designed to receive these other two voltages and give a logic signal indicating which of the voltages is the highest voltage.

12. A converter according to claim 11, wherein the four k+1 order interpolation voltages which intersect for k and k+1 order reference voltage values, are applied to another k+2 order interpolation circuit, itself giving four new k+2 order interpolation voltages, variable as a function of Vin in reverse in sets of two voltages, two of them passing through a common mean value when the voltage to be converted is equal to k+1 order reference voltage values and one passing through a maximum while the other passes through a minimum when the voltage Vin to be converted is equal to the k and k+1 order reference voltage values, the other two k+1 order interpolation voltages passing through a common mean value when the voltage Vin is equal to a k or k+1 order main reference voltage, a comparator receiving, from the k+2 order interpolation circuit, the two voltages in phase opposition that pass through a maximum or a minimum when Vin is equal to the k and k+1 order reference voltages, this logic signal indicating which of these two voltages is the highest voltage.

* * * * *